(12) United States Patent
Hass

(10) Patent No.: US 11,616,353 B2
(45) Date of Patent: Mar. 28, 2023

(54) BUSBAR AND POWER MODULE

(71) Applicant: Danfoss Silicon Power GmbH, Flensburg (DE)

(72) Inventor: Lars Hass, Nordborg (DK)

(73) Assignee: Danfoss Silicon Power GmbH, Flensburg (DE)

( * ) Notice: Subject to any disclaimer, the term of this patent is extended or adjusted under 35 U.S.C. 154(b) by 208 days.

(21) Appl. No.: 16/630,927

(22) PCT Filed: Sep. 25, 2018

(86) PCT No.: PCT/EP2018/075877
§ 371 (c)(1),
(2) Date: Jan. 14, 2020

(87) PCT Pub. No.: WO2019/063514
PCT Pub. Date: Apr. 4, 2019

(65) Prior Publication Data
US 2020/0235558 A1    Jul. 23, 2020

(30) Foreign Application Priority Data
Sep. 28, 2017  (DE) .......................... 102017217352.1

(51) Int. Cl.
*H02G 5/02* (2006.01)
*H01B 13/00* (2006.01)
*H01R 25/16* (2006.01)

(52) U.S. Cl.
CPC ........... *H02G 5/02* (2013.01); *H01B 13/0036* (2013.01); *H01R 25/161* (2013.01)

(58) Field of Classification Search
CPC ........ H05K 7/1432; H01L 2224/73265; H01L 2924/181; H01L 24/49; H01L 33/62;
(Continued)

(56) References Cited

U.S. PATENT DOCUMENTS 2,247,088 A * 6/1941 Hill ........................ H02G 5/08
174/88 R
3,235,833 A * 2/1966 Elm ..................... H01R 4/2445
439/456
(Continued)

FOREIGN PATENT DOCUMENTS

CN       101809741 A    8/2010
CN       203645094 U    6/2014
(Continued)

OTHER PUBLICATIONS

International Search Report for PCT Application No. PCT/EP2018/075877 dated Jan. 4, 2019.

*Primary Examiner* — Krystal Robinson
(74) *Attorney, Agent, or Firm* — McCormick, Paulding & Huber PLLC

(57) ABSTRACT

The present disclosure provides a busbar (100), comprising: an insulating body (110); and a busbar conductor (120, 130, 140) comprising a conductor body partially encapsulated by the insulating body and a connection terminal (121, 131, 141) extending from the conductor body and configured for connecting an electrical device, and a portion of the connection terminal is surrounded by an insulating structure (10). The present disclosure further provides a power module (200) comprising the busbar and a method of manufacturing a busbar.

21 Claims, 7 Drawing Sheets

(58) Field of Classification Search
CPC ... H01L 21/56; H01L 21/4857; H01L 21/486; H01L 2224/16145; H01L 2224/24145; H01L 23/142; H01L 23/5383; H01L 23/5385; H01L 24/33; H01L 23/48; H01B 7/08
USPC .................. 307/9.1; 336/200; 174/68, 88
See application file for complete search history.

(56) References Cited

U.S. PATENT DOCUMENTS

| | | | | |
|---|---|---|---|---|
| 3,466,745 | A * | 9/1969 | Stopp | H01B 7/00 174/117 FF |
| 3,611,242 | A * | 10/1971 | Obenhaus | H02H 3/07 338/23 |
| 3,627,901 | A * | 12/1971 | Happ | H01L 23/49551 257/E23.047 |
| 3,636,237 | A * | 1/1972 | Hafer | H02G 5/06 174/88 B |
| 3,652,897 | A * | 3/1972 | Iosue | H05F 3/04 361/230 |
| 3,818,119 | A * | 6/1974 | Sutherland | H05K 1/0263 174/72 B |
| 4,109,298 | A * | 8/1978 | Hanni | H05K 3/326 439/931 |
| 4,381,423 | A * | 4/1983 | Taylor | H02G 5/005 174/72 B |
| 4,382,156 | A * | 5/1983 | Jodoin | H02G 5/005 174/72 B |
| 4,570,031 | A * | 2/1986 | Inoue | H01G 4/06 174/72 B |
| 5,300,917 | A * | 4/1994 | Maue | H05K 1/167 338/226 |
| 5,434,749 | A * | 7/1995 | Nakayama | H05K 3/202 439/949 |
| 5,915,984 | A * | 6/1999 | Rupert | H01R 25/162 439/654 |
| 6,128,201 | A * | 10/2000 | Brown | H01L 22/20 257/E23.067 |
| 6,488,551 | B1 * | 12/2002 | Tomlin | H01R 31/085 439/47 |
| 6,521,983 | B1 * | 2/2003 | Yoshimatsu | H01L 25/072 257/678 |
| 7,042,086 | B2 * | 5/2006 | Shimoida | H01L 25/071 257/723 |
| 7,102,256 | B2 * | 9/2006 | Murakami | H02G 5/005 174/117 F |
| 8,772,634 | B2 * | 7/2014 | Beaupre | H02G 5/005 174/32 |
| 9,048,598 | B2 * | 6/2015 | Byrne | H01R 25/145 |
| D775,088 | S * | 12/2016 | Byrne | D13/154 |
| 9,795,049 | B2 * | 10/2017 | Tada | H05K 7/1432 |
| 9,979,173 | B2 * | 5/2018 | Benavides | H02G 5/005 |
| 10,026,943 | B2 * | 7/2018 | Ichikawa | H01M 50/502 |
| 10,135,355 | B2 * | 11/2018 | Doo | H02M 7/003 |
| 10,381,751 | B2 * | 8/2019 | Sayo | H01R 4/30 |
| 10,749,325 | B2 * | 8/2020 | Preising | H02G 5/005 |
| 10,784,667 | B2 * | 9/2020 | Sayo | H02G 5/005 |
| 10,804,186 | B2 * | 10/2020 | Yano | H01L 23/49558 |
| 10,951,128 | B2 * | 3/2021 | Usui | H02M 7/003 |
| 2001/0026430 | A1 * | 10/2001 | Onizuka | B60R 16/0238 361/103 |
| 2002/0024129 | A1 * | 2/2002 | Hirahara | H01L 25/071 257/691 |
| 2002/0149095 | A1 * | 10/2002 | Eldridge | H01L 25/0657 257/678 |
| 2004/0060725 | A1 * | 4/2004 | Behziz | H01B 7/0838 174/117 FF |
| 2005/0132562 | A1 * | 6/2005 | Saito | H01M 4/043 29/623.5 |
| 2007/0177358 | A1 * | 8/2007 | Schilling | H01L 25/072 361/730 |
| 2009/0040724 | A1 * | 2/2009 | Nishikimi | H02M 7/219 361/699 |
| 2010/0089641 | A1 * | 4/2010 | Esmaili | H05K 7/1432 174/70 B |
| 2010/0173509 | A1 * | 7/2010 | Holbrook | H05K 7/1432 439/208 |
| 2010/0302733 | A1 * | 12/2010 | Woody | H01L 25/071 361/699 |
| 2010/0327654 | A1 * | 12/2010 | Azuma | H05K 7/1432 307/9.1 |
| 2011/0195301 | A1 * | 8/2011 | Taniguchi | H01M 50/116 29/623.2 |
| 2011/0254649 | A1 * | 10/2011 | Hollevoet | H01F 27/2852 336/200 |
| 2012/0214060 | A1 | 8/2012 | Taguchi et al. | |
| 2015/0035496 | A1 * | 2/2015 | Kikuchi | B60L 50/10 320/137 |
| 2016/0172650 | A1 * | 6/2016 | Ichikawa | H01M 50/502 29/623.1 |
| 2016/0234926 | A1 * | 8/2016 | Bittner | H05K 7/12 |
| 2017/0148770 | A1 * | 5/2017 | Ishino | H01L 24/48 |
| 2017/0229379 | A1 * | 8/2017 | Hayase | H02G 5/005 |
| 2018/0109253 | A1 * | 4/2018 | Tanabe | B60L 3/003 |

FOREIGN PATENT DOCUMENTS

| | | | | |
|---|---|---|---|---|
| CN | 103915738 A | | 7/2014 | |
| CN | 204464687 U | | 7/2015 | |
| EP | 2581967 A2 | | 4/2013 | |
| JP | 2000152604 A | * | 5/2000 | |
| JP | 2012-005300 A | | 1/2012 | |
| JP | 2013161547 A | | 8/2013 | |
| WO | WO-2007094162 A1 | * | 8/2007 | ............ H02M 5/271 |

\* cited by examiner

BUSBAR AND POWER MODULE

CROSS-REFERENCE TO RELATED APPLICATIONS

This application is a National Stage application of International Patent Application No. PCT/EP2018/075877, filed on Sep. 25, 2018, which claims priority to German Application No. 102017217352.1, filed Sep. 28, 2017, each of which is hereby incorporated by reference in its entirety.

TECHNICAL FIELD

Embodiments of the present disclosure generally relate to the field of power electronics, and in particular, to a busbar and a power module having the same.

BACKGROUND

Busbar has been employed widely in electric power modules, such as a power converter or power conversion device, for connecting power elements such as IGBTs, rectifier diodes and the like or for achieving power control such as in inverters or frequency converters.

The busbar generally has many connection terminals, such as pins, legs or lugs, for connecting an electrical device, such as a connector, a printed circuit board, Direct Bonded Copper (DBC) substrate, IGBT, rectifier diode or the like. In order to avoid electric leakage or discharge, a sufficient clearance and/or creepage distance is required between adjacent connection terminals, especially in a higher voltage environment. The distance between adjacent connection terminals will be often restricted and not easily adjusted due to strict requirements for layout and space sizes of elements.

SUMMARY

The present disclosure is made to overcome or eliminate at least one of the above and other problems and defects.

An object of the present disclosure is to provide a busbar and a power module having the same, for at least solving the restricted clearance or creepage distance issue.

According to an aspect of the present disclosure, an embodiment provides a busbar, comprising: an insulating body; and a busbar conductor comprising a conductor body partially encapsulated by the insulating body and a connection terminal extending from the conductor body and configured for connecting an electrical device, and a portion of the connection terminal is surrounded by an insulating structure.

In one embodiment, the busbar conductor comprises a plurality of the connection terminals arranged side by side at an interval, and at least one of two adjacent connection terminals is partially surrounded by the insulating structure.

In one embodiment, each connection terminal comprises a connection end portion for connecting the electrical device, and the insulating structure is wrapped around all other portions of the connection terminal except the connection end portion.

In one embodiment, the insulating structure extends integrally from the insulating body along a path from the conductor body to the connection end portion.

In one embodiment, the insulating structure is formed in form of a sleeve.

In one embodiment, the busbar conductor comprises a first sub-busbar conductor and a second sub-busbar conductor overlapping each other, the insulating body comprises a first insulating layer provided on a surface of the first sub-busbar conductor facing away from the second sub-busbar conductor, a second insulating layer provided between the first sub-busbar conductor and the second sub-busbar conductor, and a third insulating layer provided on a surface of the second sub-busbar conductor facing away from the first sub-busbar conductor, the first, second and third insulating layers being arranged to electrically insulate the first sub-busbar conductor from the second sub-busbar conductor, and the insulating structure is formed by at least one of the first, second and third insulating layers.

In one embodiment, one of the first sub-busbar conductor and the second sub-busbar conductor is a direct current positive busbar conductor, and the other is a direct current negative busbar conductor.

In one embodiment, the first sub-busbar conductor comprises a plurality of first connection terminals, the second sub-busbar conductor comprises a plurality of second connection terminals, the first connection terminals and the plurality of second connection terminals are alternately arranged at the same side of the busbar, and at least one of one first connection terminal and one second connection terminal adjacent to each other is partially wrapped by the insulating structure.

In one embodiment, the busbar further comprises a third sub-busbar conductor arranged to overlap and be electrically insulated from the first sub-busbar conductor and the second sub-busbar conductor, the third sub-busbar conductor comprising a plurality of third connection terminals, the first sub-busbar conductor comprises a plurality of first connection terminals arranged at a first side of the busbar, the second sub-busbar conductor comprises a plurality of second connection terminals arranged at a second side of the busbar different from the first side, some of the plurality of third connection terminals are arranged at the first side so as to alternate with the first connection terminals, or at the second side so as to alternate with the second connection terminals (131); and at least one of one first or second connection terminal and one third connection terminal adjacent to each other is partially wrapped by the insulating structure.

In one embodiment, the third sub-busbar conductor is an alternating current busbar conductor.

In one embodiment, at least one of the first, second and third insulating layers comprises a portion located between the insulating structure and the third connection terminal which are located adjacent to each other.

According to another aspect of the present disclosure, an embodiment further provides a power module comprising the busbar as described in any of embodiments of the present disclosure.

In one embodiment, the power module further comprises a housing, which could be an insulating housing, and a connection surface, the busbar is received in the housing such that some of the connection terminals are connected to the connection surface, and a soft gel material is filled in the insulating housing at a height from the welding surface to a lower end of the insulating structure. The soft gel material is an electrical insulator, as well as forming physical protection for the electrical components mounted on the connection surface. The fact that the soft gel material feels the insulating housing from at least the welding surface to the lower end of the insulating structure means that the electrical conductor formed by the busbar and the connection terminal is completely electrically insulated for all of its length from the main bus bar conductor to each section of the connection terminal. In particular when high voltages are involved, this is a great advantage since it substantially increases the creepage distances relevant to the circuit. It may also be an advantage if the main part of the busbar conductor lies at a different plane to the welding surface of the lower end of the insulating structure. For example, it may be that the remain part of the busbar conductor is elevated above the connection surface onto which the lower end of the connection terminal is affixed. Such a height difference may be important to increase the clearance between different conductors in the power module. The connection surface may comprise a printed circuit board (PCB), a direct copper bonded (DBC) substrate, or other substrates known in the field. The connection of one or more of the connection terminal to the connection surface may be by welding (including ultrasonic welding), brazing, soldering, sintering or by other connection technologies known within the field.

According to a further aspect of the present disclosure, an embodiment provides a method of manufacturing a busbar, comprising:

providing a first insulation sheet with a first protruding portion extending outwardly from a side thereof;

providing a busbar conductor sheet with a shaped connection terminal extending outwardly from a side thereof;

placing the insulation sheet and the busbar conductor sheet with the shaped connection terminal into a tool, such that the busbar conductor sheet is placed on an upper surface of the first insulation sheet and the first protruding portion is shaped to cover at least a portion of the connection terminal from below;

placing a second insulation sheet with a second protruding portion extending outwardly from a side thereof on an upper surface of the busbar conductor sheet, such that the second insulation sheet, the busbar conductor sheet and the first insulation sheet are stacked into a sandwich arrangement and the second protruding portion is shaped to cover at least the portion of the connection terminal from above; and joining the second insulation sheet, the busbar conductor sheet and the first insulation sheet to one another, such that the first protruding portion and the second protruding portion are joined together to form an insulating structure wrapped around the portion of the connection terminal.

In one embodiment, the insulating structure is formed into a sleeve partially surrounding the connection terminal with a free end of the connection terminal being exposed.

In one embodiment, the busbar conductor sheet comprises a plurality of the connection terminals arranged side by side at an interval, and at least one of two adjacent connection terminals is partially surrounded by the insulating structure.

In one embodiment, the joining the second insulation sheet, the busbar conductor sheet and the first insulation sheet to one another comprises: applying a pressure and/or a raised temperature to the sandwich arrangement.

BRIEF DESCRIPTION OF THE DRAWINGS

The above and other aspects and features of the present disclosure will become more apparent by describing in detail exemplary embodiments thereof with reference to the accompanying drawings, in which.

DETAILED DESCRIPTION

Figure 1A:
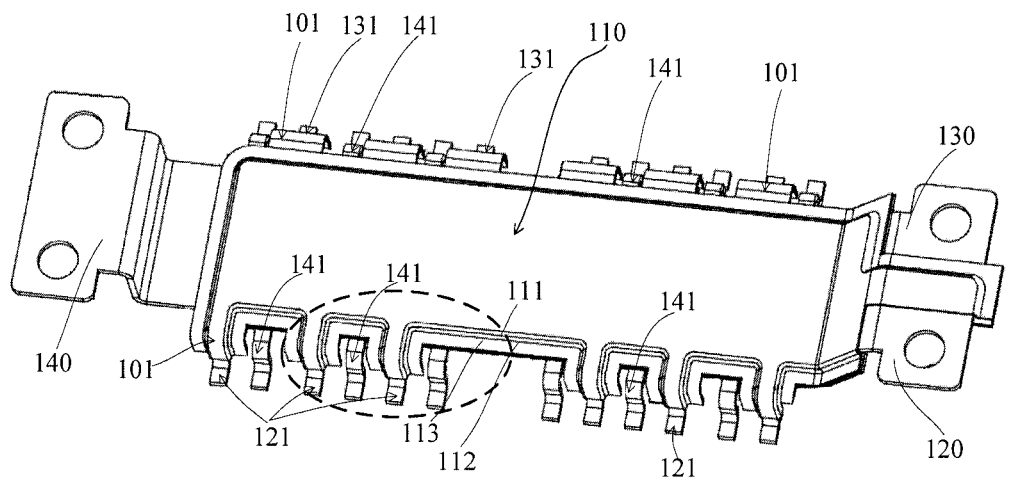
FIG. 1A is a perspective view schematically showing a structure of a busbar according to an exemplary embodiment of the present disclosure.

Technical solutions of the present disclosure will be further described in detail in combination with exemplary embodiments with reference to the attached drawings. In the description, the same or like reference numbers refer to the same or like elements. The following description of exemplary embodiments of the present disclosure made with reference to the attached drawings is intended to illustrate the general inventive concepts of the present disclosure, and should not be interpreted as being limitative to the present disclosure.

According to a general inventive concept of the present disclosure, there is provided a busbar, comprising a connection terminal configured for connecting an electrical device, and an insulating structure wrapped around or surrounding a portion of the connection terminal, thereby a creepage distance (the shortest distance measured along the surface) between adjacent connection terminals can be increased.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
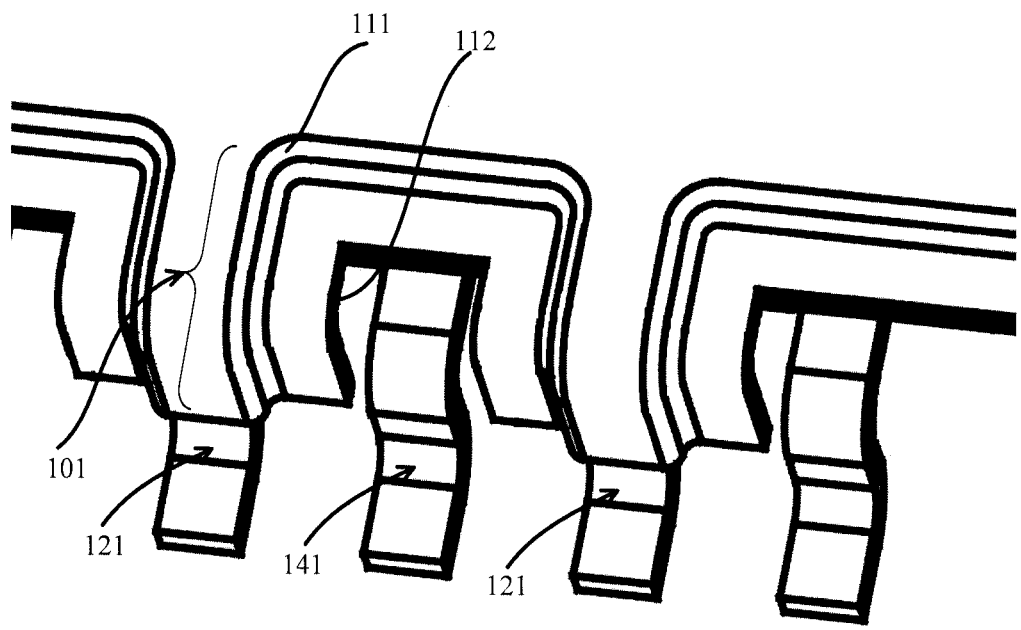
FIG. 1B is a partially enlarged view schematically showing a portion of the busbar indicated by the dashed circle shown in FIG. 1A.

FIG. 1A is a perspective view schematically showing a structure of a busbar 100 according to an exemplary embodiment of the present disclosure, and FIG. 1B is a partially enlarged view schematically showing a portion of the busbar indicated by the dashed circle shown in FIG. 1A. As shown, the busbar 100 comprises an insulating body 110, and a busbar conductor (120, 130, 140), the busbar conductor comprising a conductor body, which, for example, is generally in a plate or sheet shape and is partially encapsulated by the insulating body 110, and a plurality of connection terminals 121, 131, 141 arranged side by side at an interval. The connection terminal extend from the conductor body and is configured for connecting an electrical device, such as a connector, a printed circuit board, IGBT, rectifier diode or the like. In some examples, the connection terminal may be a lug, leg, pin or the like.

In a conventional busbar, the connection terminals are generally exposed from the insulating body, thus in order to avoid electric leakage or discharge between connection terminals at different electrical potentials, a sufficient physical or space distance needs to be provided between adjacent connection terminals to ensure sufficient clearances (the shortest distance in air) and creepage distances (the shortest distance along the surface) therebetween, especially in a higher voltage environment. The distance between adjacent connection terminals is often restricted and not easily adjusted due to strict requirements for layout and space sizes of elements. In an embodiment of the present disclosure, as shown in FIGS. 1A and 1B, an insulating structure 101 is wrapped or encapsulated around a portion of at least one of two adjacent connection terminals, which may be at different electrical potentials during operation, thereby preventing electric leakage or discharge from occurring between adjacent connection terminals.

With the busbar provided with the insulating structure between adjacent connection terminals, the clearance/creepage distance problems, particularly occurring at high voltages, can be solved and a higher operating voltage is possible for the busbar or a power module having the busbar. Further, the connection terminals may be placed close together, a space can be saved accordingly, such that a design of layout for the power module can be very compact and a high power density is possible.

Figure 1C:
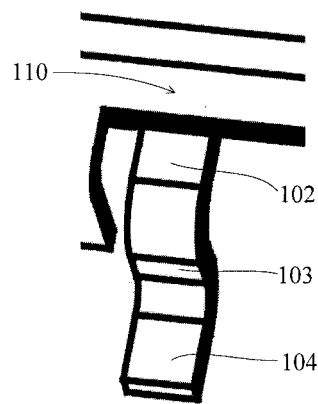
FIG. 1C is a schematic diagram showing a structure of a connection terminal of a busbar according to an exemplary embodiment of the present disclosure.

In an embodiment of the present disclosure, as shown in FIG. 1C, each connection terminal may comprise a section 102 extending from the conductor body, a connection end portion 104 for connecting the electrical device, and an intermediate section 103 extending between the section 102 and the connection end portion 104. In the illustrated example, the section 102 extends substantially horizontally and outwardly from the conductor body, the intermediate section 103 extends substantially vertically and downwardly from the section 102, and connection end portion 104 extends substantially horizontally and outwardly from the intermediate section 103. It will be appreciated that types, shapes, positions and numbers of the connection terminals are not limited to those shown in figures and may be set as required.

In an exemplary embodiment, the insulating structure 101 is wrapped around all other portions, including the section 102 and the intermediate section 103, of the connection terminal except the connection end portion 104, thereby further ensuring the clearance/creepage distance between adjacent connection terminals, which may be at different electrical potentials during operation.

In some embodiments, the insulating structure may extend integrally from the insulating body, for example along a path from the conductor body to the connection end portion. In other words, the insulating structure may be formed integrally with the insulating body. In other embodiments, the insulating structure is formed as a separate part which may be connected or engaged with the insulating body. Exemplarily, the insulating structure may be formed in form of a bushing or sleeve, sleeve, tube or other shape suitable for at least partially encapsulating the connection terminal.

In the embodiment shown in FIG. 1A, the busbar 100 comprises a direct current (DC) positive busbar conductor 120 and a DC negative busbar conductor 130, which for example overlap each other. The insulating body 110 comprises a first insulating layer 111, a second insulating layer 112 and a third insulating layer 113, the first insulating layer 111 is provided on a surface of the positive busbar conductor 120 facing away from the negative busbar conductor 130, the second insulating layer is 112 provided between the positive busbar conductor 120 and the negative busbar conductor 130, the third insulating layer 113 is provided on a surface of the negative busbar conductor 130 facing away from the positive busbar conductor 120, thereby forming a laminated bus arrangement, like a sandwiched structure. The first insulating layer 111, the second insulating layer 112 and the third insulating layer 113 are arranged to electrically insulate the positive busbar conductor 120 from the negative busbar conductor 130. In an example, the insulating structure 101 is formed by at least one of the first insulating layer 111, the second insulating layer 112 and the third insulating layer 113. For example, referring to FIG. 1B, the insulating structure 101 is formed by portions of the first insulating layer 111 and the second insulating layer 112, which sandwich the connection terminal therebetween and are sealed at side edges thereof.

In an exemplary embodiment of the present disclosure, the positive busbar conductor 120 comprises a plurality of connection positive terminals 121, the negative busbar conductor 130 comprises a plurality of connection negative terminals 131. In some examples no shown, the connection positive terminals and the plurality of connection negative terminals may be alternately arranged at the same side of the busbar, and at least one of one connection positive terminal and one connection negative terminal adjacent to each other is partially wrapped or surrounded by the insulating structure.

Figure 2A:
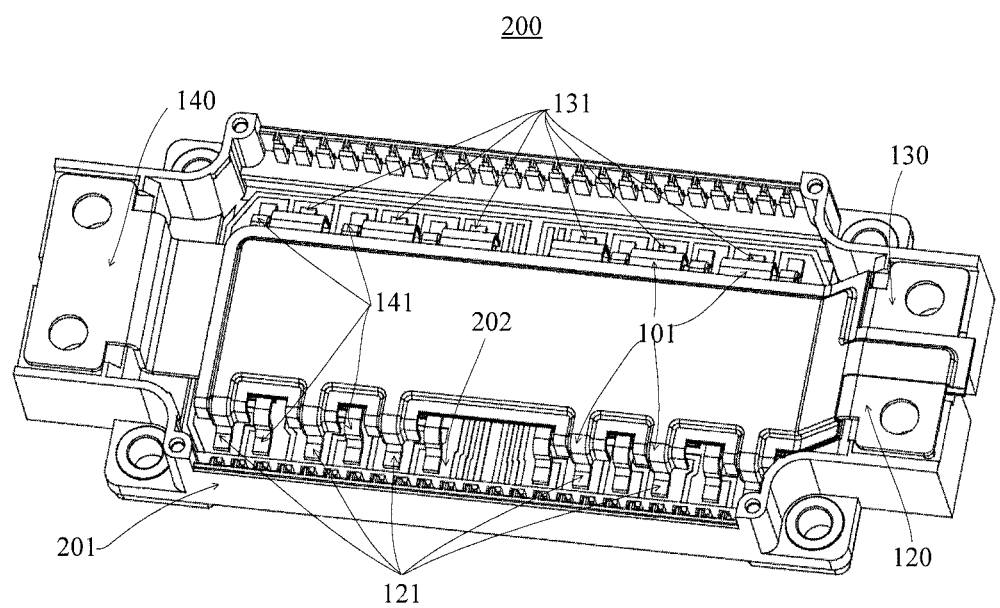
FIG. 2A is a perspective view schematically showing an arrangement of a power module provided with a busbar according to an exemplary embodiment of the present disclosure.
Figure 2B:
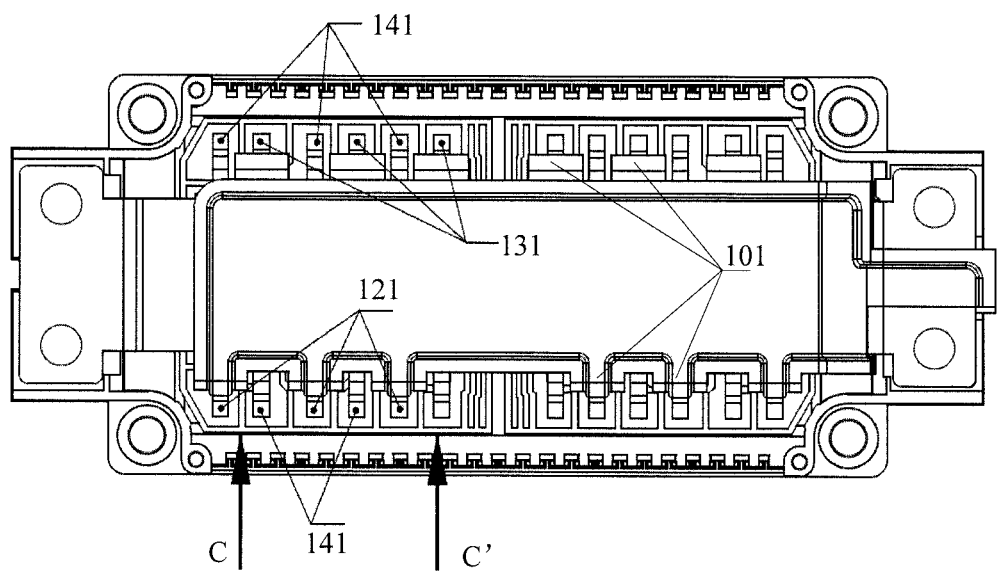
FIG. 2B is a top view schematically showing the power module shown in FIG. 2A.

In some embodiments, referring to FIGS. 1A, 2A and 2B, the connection positive terminals 121 are arranged at a first side of the busbar 100, the connection negative terminals 131 are arranged at a second side of the busbar different from, for example, opposite to, the first side. Further, the busbar 100 may further comprise an alternating current (AC) busbar conductor 140, the AC busbar conductor 140 is arranged to overlap the positive busbar conductor 120 and the negative busbar conductor 130 and is electrically insulated from the positive busbar conductor 120 and the negative busbar conductor 130, for example, by the first insulating layer 111 or by the third insulating layer 113. The alternating current busbar conductor 140 may comprise a plurality of alternating current (AC) connection terminals 141. In some examples, some AC connection terminals 141 are arranged at the first side so as to alternate with the connection positive terminals 121, and/or some AC connection terminals 141 are arranged at the second side so as to alternate with the connection negative terminals 131. In such examples, the insulating structure is partially wrapped around at least one of one connection positive terminal or connection negative terminal and one AC connection terminal adjacent to each other. For example, referring to FIGS. 1A, 2A and 2B, the connection positive terminal 120 and the connection negative terminal 130 are each partially wrapped therearound by the insulating structure 101. In other examples not shown, the insulating structure may be partially wrapped around the AC connection terminals.

In an exemplary embodiment, at least one of the first, second and third insulating layers comprises a portion located between the insulating structure and the alternating current connection terminal which are located adjacent to each other. Referring to FIGS. 1A and 1B, a portion of the third insulating layer extends be between the insulating structure 101 and the AC connection terminal 140, thereby further ensuring the clearance/creepage distance between the connection positive terminal or connection negative terminal and the AC connection terminal which are located adjacent to each other and may be at different electrical potentials during operation.

Figure 2C:
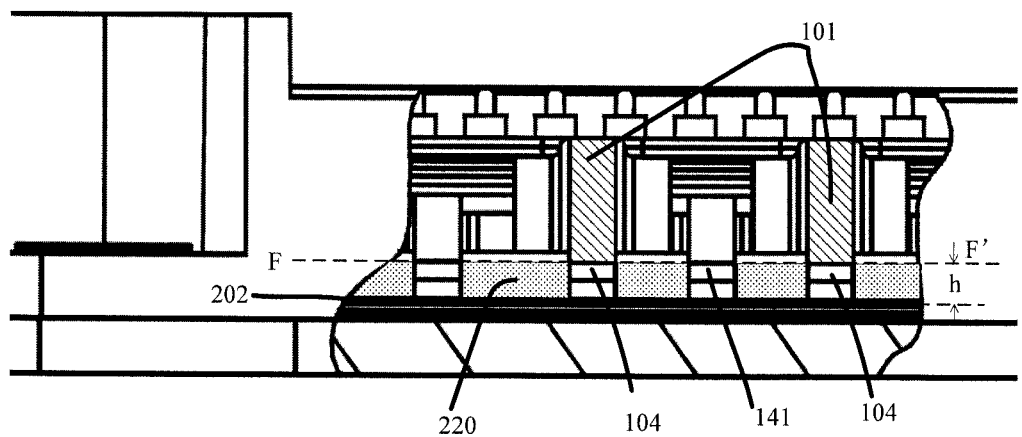
FIG. 2C is a partial cross sectional view schematically showing a portion of the power module, taken along a line C-C' shown in FIG. 2B.

FIGS. 2A to 2C schematically show a power module 200. The power module 200 comprises the busbar 100. For example, the power module may be a power converter or power conversion device, which may be used in a variety of applications from smaller, low voltage, computer, electronic, and telecommunications systems to larger, higher voltage transportation systems such as trains and electric vehicles.

As shown, the power module 200 further comprises an insulating housing 201, the busbar 100 is received in the insulating housing 201. In an example, the power module 200 or the insulating housing 201 may be provided with a connection surface 202 or other mounting surface, for example, a connection surface or pad of a printed circuit board of the power module installed in the insulating housing, and some of the connection terminals may be welded, brazed, sintered, soldered or connected by other known technologies, onto the connection surface.

In a further exemplary embodiment of the disclosure, as shown in FIG. 2C, a soft gel material 220 may filled in the insulating housing 201, for example, in a space between the exposed connection end portion of a connection terminal and its adjacent connection terminal which is not wrapped or covered with the insulating structure, further ensuring the clearance/creepage distance between the exposed connection end portion and its adjacent connection terminal. In an example, the soft gel material 220 may has a filling height h from the welding surface 202 to a lower end of the insulating structure 101, as shown in FIG. 2C. Thereby, portions, including the section 102 and the intermediate section 103, of the connection terminal above a plane F-F' where the lower ends of the insulating structures 101 are located are wrapped and insulated by the insulating structure 101, while the connection end portion 104 of the connection terminal below the plane is enclosed and insulated by the gel material 220. With the combination of the insulating structure with the filled soft gel material, the complete busbar may be insulated inside the power module whereby a smaller or even no clearance/creepage distance is needed between terminals at different electrical potentials.

Figure 3:
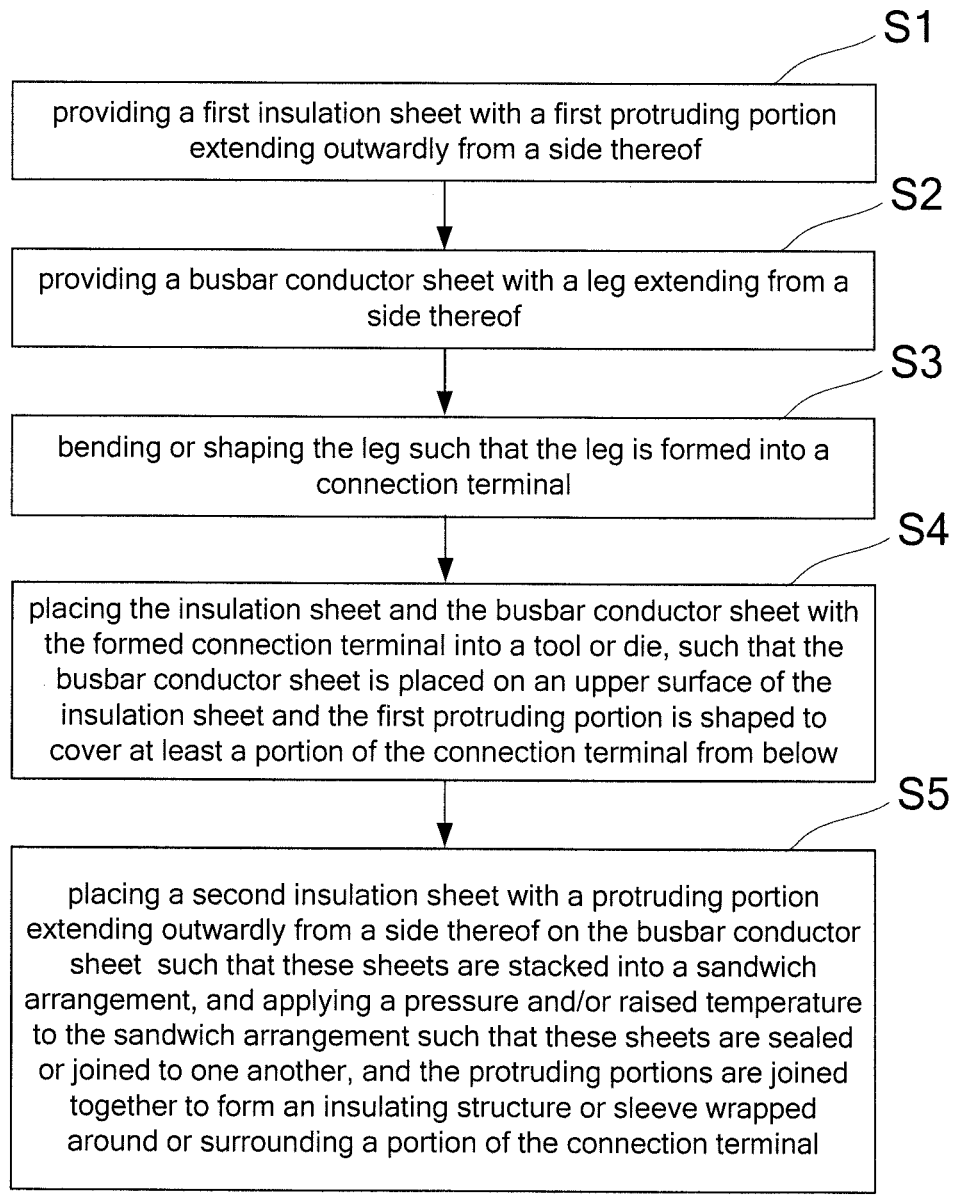
FIG. 3 is a flow chart of a method of assembling or manufacturing a busbar according to an exemplary embodiment of the present disclosure.
Figure 4A:
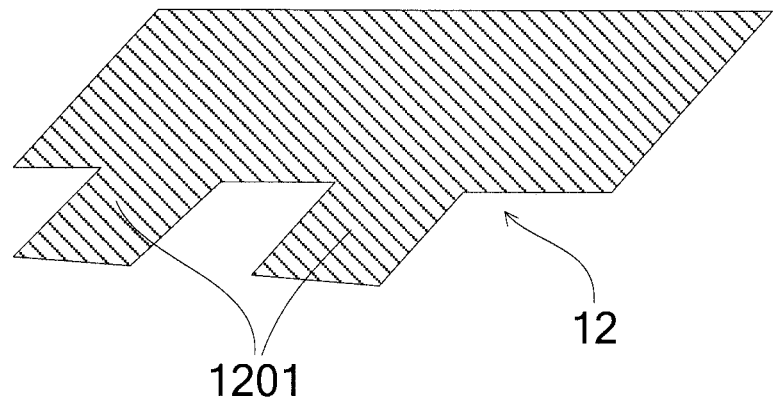
FIGS. 4A-4E are structural perspective views schematically showing steps of the method shown in FIG. 3 respectively.
Figure 4B:
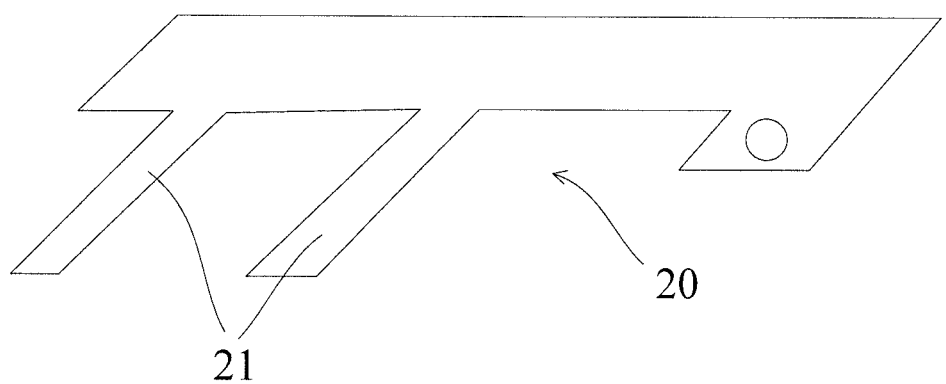
Figure 4C:
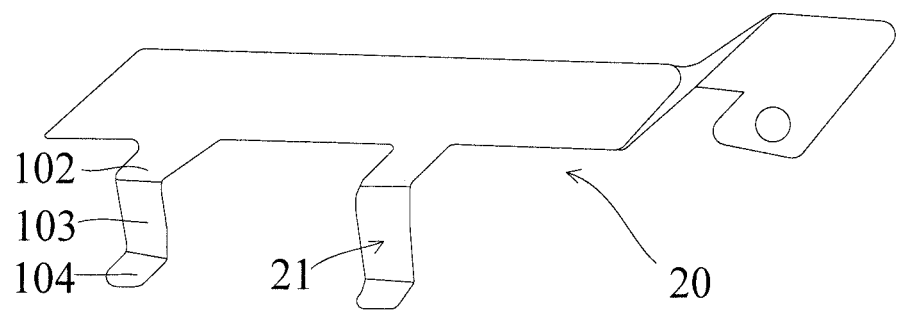
Figure 4D:
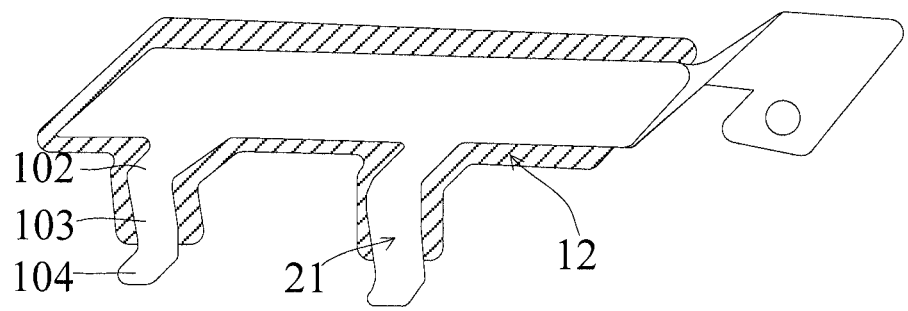
Figure 4E:
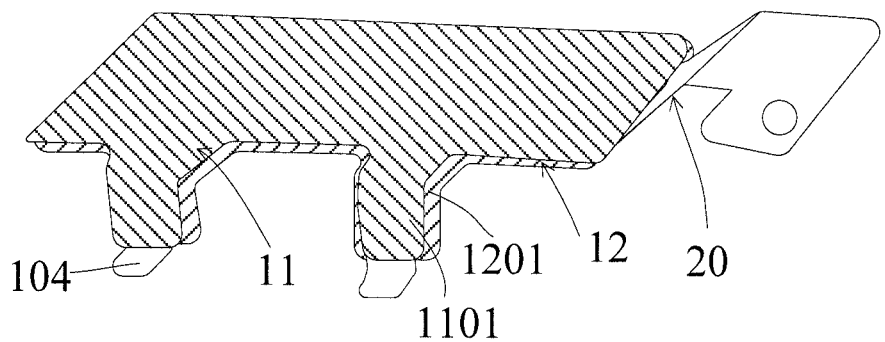

An embodiment of the present disclosure further provides a method of assembling or manufacturing a busbar. As shown in FIG. 3, the method mainly comprising following steps:

Step S1: providing a first insulation sheet 12 with a first protruding portion 1201 extending outwardly from a side thereof, as shown in FIG. 4A, the first protruding portion being shaped to form a portion of the sleeve as described above; exemplarily, the insulation sheet may have a flat body and may be used to form one of the first insulating layer 111, the second insulating layer 112 and the third insulating layer 113 described above;

Step S2: providing a busbar conductor sheet 20 with a protruding section or leg 21 extending from a side thereof, as shown in FIG. 4B, the protruding section or leg 21 being shaped to form one of the connection terminals as described above; exemplarily, the busbar conductor sheet may have a flat conductor body and may be used to form one of the busbar conductors 120, 130 and 140 describe above; in an example, the busbar conductor sheet may be made of a metal foil such as copper foil or other conductive material;

Step S3: bending or shaping the protruding section or leg 21 such that the protruding section or leg 21 is formed into a connection terminal, which for example, as shown in FIG. 4D, comprises a section 102 extending from the conductor body, a connection end portion 104 for connecting an electrical device, and an intermediate section 103 extending between the section 102 and the connection end portion 104 as described above;

Step S4: placing the insulation sheet and the busbar conductor sheet with the formed connection terminal into a tool or die (not shown), such that the busbar conductor sheet is placed on an upper surface of the insulation sheet and the protruding portion 1201 is shaped (for example, bent) to cover at least a portion, for example, the section 102 and the intermediate section 103, of the connection terminal from below, as shown in FIG. 4D;

Step S5: placing a second insulation sheet 11, which has a second protruding portion 1101 extending outwardly from a side thereof, similar to the insulation sheet 12 shown in FIG. 4A, on an upper surface of the busbar conductor sheet 20, such that the second insulation sheet 11, the busbar conductor sheet 20 and the first insulation sheet 12 are stacked into a sandwich arrangement and the protruding portion 1101 is shaped (for example, bent) to cover at least a portion, for example, the section 102 and the intermediate section 103, of the connection terminal from above, and applying a pressure and/or a raised temperature to the sandwich arrangement such that the second insulation sheet 11, the busbar conductor sheet 20 and the first insulation sheet 12 are sealed or joined to one another, the protruding portion 1101 and the protruding portion 1201 are joined together to form an insulating structure or sleeve wrapped around or surrounding a portion of the connection terminal, thereby a creepage distance between adjacent connection terminals can be increased.

In some embodiments, an adhesive may be coated onto at least one of surfaces of the second insulation sheet, the busbar conductor sheet and the first insulation sheet facing each other such that these sheets may be held in position relative to each other when applying the pressure and/or raised temperature. It is noted that before applying the pressure and/or raised temperature, additional insulation sheet(s) and/or additional busbar conductor sheet(s) may be stacked successively on the above sandwich arrangement so as to form a multi-layer busbar structure. It is also noted that the sequence of the above steps may be not limited to those described above and illustrated in the figures, and may be changed in some case; for example, the above steps S1 and S2 may be carried out at the same time or the step S2 may be carried before the step S1, or the steps S2 and S3 may be combined in one step by shaping a conductive sheet (for example, a metal foil) into the busbar conductor sheet 20 shown in FIG. 4C through a punch forming process.

Figure 5:
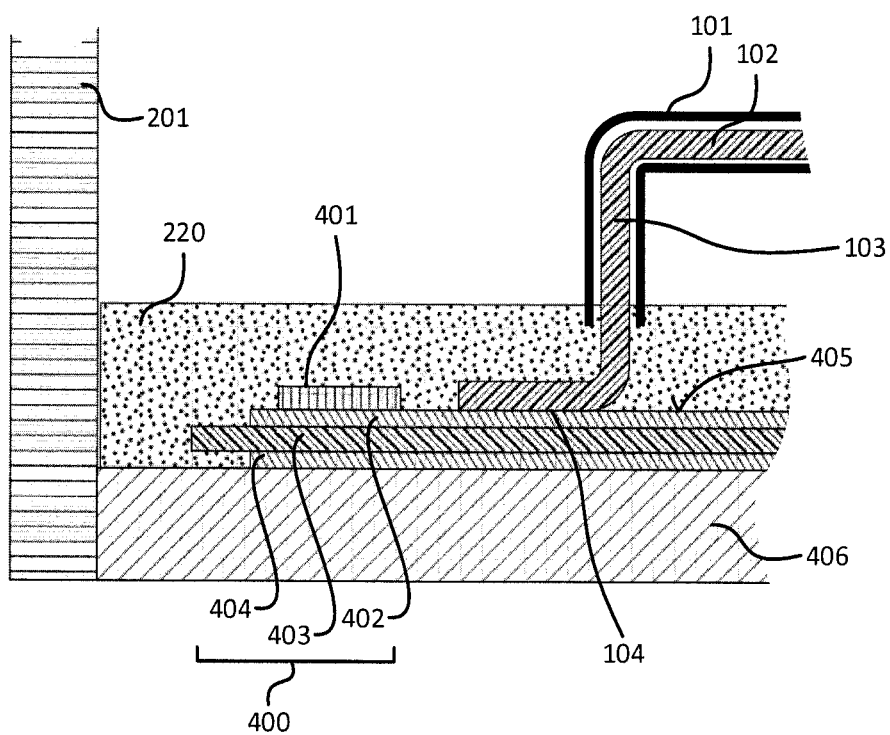
FIG. 5 shows a partial cross sectional view schematically showing a portion of a connection terminal.

FIG. 5 shows a partial cross sectional view schematically showing a portion of a connection terminal. Here, the connection terminal as shown having a section 102 extending from the conductor body (not shown), a connection end portion 104 for connecting the electrical device, and an intermediate section 103 extending between the section 102 and the connection end portion 104. In this embodiment the insulating structure 101 is wrapped around all of the portions of the connection terminal with the exception of the connection end portion 104. The connection end portion 104 is connected by soldering or welding or sintering to the connection surface 405. This connection surface is formed in this embodiment by one surface of a metal sheet which is part of a substrate structure known as a DBC (directly bonded copper) substrate 400. Such substrates are well known in the field and comprise a central ceramic insulator 403 clad on both sides by copper conducting tracks 402 and 404. Also shown in FIG. 5 is an exemplary component 401 which is connected to the upper conducting tracks 402 to which the connection terminal is connected. The exemplary component 401 may be a semiconductor, a diode, resistor, or other known electronic component. The DBC substrate 400 is in turn mounted on a baseplate 406 which in this case forms the major structure of the completed power module. A housing 201 is also illustrated. The interior of the housing 201 is partially filled with a soft gel material 220 which reaches from the baseplate 406, envelops the substrate 400 and the component 401 and also the lower part of the connection terminal 104. Importantly, the upper level of the soft gel material 220 is slightly higher than the lower end point of the insulating structure 101. This feature means that the electrically conducting part of the busbar/connection terminal is completely surrounded by an insulating material; either the soft gel material 220, or the insulating structure 101. This ensures that creepage distances are large.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A busbar, comprising:
   an insulating body; and
   a busbar conductor comprising a conductor body partially encapsulated by the insulating body and a connection terminal extending from the conductor body and configured for connecting an electrical device,
   wherein a portion of the connection terminal is surrounded by an insulating structure, such that the insulating structure covers the portion of the connection terminal from above, and covers the portion of the connection terminal from below,
   wherein the busbar conductor comprises a plurality of the connection terminals arranged side by side at an interval, and wherein at least one of two adjacent connection terminals is partially surrounded by the insulating structure.

2. The busbar according to claim 1, wherein the connection terminal comprises a connection end portion for connecting the electrical device, and the insulating structure is wrapped around all other portions of the connection terminal except the connection end portion.

3. The busbar according to claim 2, wherein the insulating structure extends integrally from the insulating body along a path from the conductor body to the connection end portion.

4. The busbar according to claim 3, wherein the busbar conductor comprises a first sub-busbar conductor and a second sub-busbar conductor overlapping each other,
   the insulating body comprises a first insulating layer provided on a surface of the first sub-busbar conductor facing away from the second sub-busbar conductor, a second insulating layer provided between the first sub-busbar conductor and the second sub-busbar conductor, and a third insulating layer provided on a surface of the second sub-busbar conductor facing away from the first sub-busbar conductor, the first, second and third insulating layers being arranged to electrically insulate the first sub-busbar conductor from the second sub-busbar conductor, and
   the insulating structure is formed by at least one of the first, second and third insulating layers.

5. The busbar according to claim 2, wherein the busbar conductor comprises a first sub-busbar conductor and a second sub-busbar conductor overlapping each other,
   the insulating body comprises a first insulating layer provided on a surface of the first sub-busbar conductor facing away from the second sub-busbar conductor, a second insulating layer provided between the first sub-busbar conductor and the second sub-busbar conductor, and a third insulating layer provided on a surface of the second sub-busbar conductor facing away from the first sub-busbar conductor, the first, second and third insulating layers being arranged to electrically insulate the first sub-busbar conductor from the second sub-busbar conductor, and
   the insulating structure is formed by at least one of the first, second and third insulating layers.

6. The busbar according to claim 1, wherein the insulating structure is formed in form of a sleeve.

7. The busbar according to claim 1, wherein the busbar conductor comprises a first sub-busbar conductor and a second sub-busbar conductor overlapping each other,
   the insulating body comprises a first insulating layer provided on a surface of the first sub-busbar conductor facing away from the second sub-busbar conductor, a second insulating layer provided between the first sub-busbar conductor and the second sub-busbar conductor, and a third insulating layer provided on a surface of the second sub-busbar conductor facing away from the first sub-busbar conductor, the first, second and third insulating layers being arranged to electrically insulate the first sub-busbar conductor from the second sub-busbar conductor, and
   the insulating structure is formed by at least one of the first, second and third insulating layers.

8. The busbar according to claim 7, wherein one of the first sub-busbar conductor and the second sub-busbar conductor is a direct current positive busbar conductor, and the other is a direct current negative busbar conductor.

9. The busbar according to claim 7, wherein the first sub-busbar conductor comprises a plurality of first connection terminals, the second sub-busbar conductor comprises a plurality of second connection terminals,
   the first connection terminals and the plurality of second connection terminals are alternately arranged at the same side of the busbar, and at least one of one first connection terminal and one second connection terminal adjacent to each other is partially wrapped by the insulating structure.

10. The busbar according to claim 7, further comprising a third sub-busbar conductor arranged to overlap and be electrically insulated from the first sub-busbar conductor and the second sub-busbar conductor, the third sub-busbar conductor comprising a plurality of third connection terminals,
    wherein the first sub-busbar conductor comprises a plurality of first connection terminals arranged at a first side of the busbar, the second sub-busbar conductor comprises a plurality of second connection terminals arranged at a second side of the busbar different from the first side,
    wherein some of the plurality of third connection terminals are arranged at the first side so as to alternate with the first connection terminals, or at the second side so as to alternate with the second connection terminals, and
    wherein at least one of one first or second connection terminal and one third connection terminal adjacent to each other is partially wrapped by the insulating structure.

11. The busbar according to claim 10, wherein the third sub-busbar conductor is an alternating current busbar conductor.

12. The busbar according to claim 10, wherein at least one of the first, second and third insulating layers comprises a portion located between the insulating structure and the third connection terminal which are located adjacent to each other.

13. A power module, comprising the busbar according to claim 1.

14. The power module according to claim 13, wherein the power module further comprises a housing and a connection surface,
the busbar is received in the insulating housing such that some of the connection terminals are connected to the connection surface, and
a soft gel material is filled in the insulating housing at a height from the welding surface to a lower end of the insulating structure.

15. The busbar according to claim 1, wherein a connection end portion of the connection terminal below a plane is enclosed and insulated by a gel material.

16. A method of manufacturing a busbar, comprising:
providing a first insulation sheet with a first protruding portion extending outwardly from a side thereof;
providing a busbar conductor sheet with a shaped connection terminal extending outwardly from a side thereof;
placing the insulation sheet and the busbar conductor sheet with the shaped connection terminal into a die, such that the busbar conductor sheet is placed on an upper surface of the first insulation sheet and the first protruding portion is shaped to cover at least a portion of the connection terminal from below;
placing a second insulation sheet with a second protruding portion extending outwardly from a side thereof on an upper surface of the busbar conductor sheet, such that the second insulation sheet, the busbar conductor sheet and the first insulation sheet are stacked into a sandwich arrangement and the second protruding portion is shaped to cover at least the portion of the connection terminal from above; and
joining the second insulation sheet, the busbar conductor sheet and the first insulation sheet to one another, such that the first protruding portion and the second protruding portion are joined together to form an insulating structure wrapped around the portion of the connection terminal.

17. The method according to claim 16, wherein the insulating structure is formed into a sleeve partially surrounding the connection terminal with a free end of the connection terminal being exposed.

18. The method according to claim 16, wherein the busbar conductor sheet comprises a plurality of the connection terminals arranged side by side at an interval, and
at least one of two adjacent connection terminals is partially surrounded by the insulating structure.

19. The method according to claim 16, wherein the joining the second insulation sheet, the busbar conductor sheet and the first insulation sheet to one another comprises:
applying a pressure and/or a raised temperature to the sandwich arrangement.

20. The method of manufacturing a busbar according to claim 16, wherein a connection end portion of the connection terminal below a plane is enclosed and insulated by a gel material.

21. A busbar, comprising:
an insulating body; and
a busbar conductor comprising a conductor body partially encapsulated by the insulating body and a connection terminal extending from the conductor body and configured for connecting an electrical device,
wherein a portion of the connection terminal is surrounded by an insulating structure, such that the insulating structure covers the portion of the connection terminal from above, and covers the portion of the connection terminal from below,
wherein the connection terminal extends from the conductor body at an intermediate position between two opposite ends of the busbar conductor,.
wherein the busbar conductor comprises a plurality of the connection terminals arranged side by side at an interval, and
wherein at least one of two adjacent connection terminals are partially surrounded by the insulating structure.

* * * * *